(12) United States Patent
Kanaya

(10) Patent No.: US 12,300,637 B2
(45) Date of Patent: May 13, 2025

(54) SEMICONDUCTOR APPARATUS

(71) Applicant: Mitsubishi Electric Corporation, Tokyo (JP)

(72) Inventor: Ko Kanaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 341 days.

(21) Appl. No.: 18/003,245

(22) PCT Filed: Oct. 1, 2020

(86) PCT No.: PCT/JP2020/037425
§ 371 (c)(1),
(2) Date: Dec. 23, 2022

(87) PCT Pub. No.: WO2022/070384
PCT Pub. Date: Apr. 7, 2022

(65) Prior Publication Data
US 2023/0253347 A1 Aug. 10, 2023

(51) Int. Cl.
*H01L 23/62* (2006.01)
*H01L 23/00* (2006.01)
(Continued)

(52) U.S. Cl.
CPC ............ *H01L 23/62* (2013.01); *H01L 23/041* (2013.01); *H01L 23/49513* (2013.01);
(Continued)

(58) Field of Classification Search
CPC ....... H01L 23/02; H01L 23/041; H01L 23/12; H01L 23/13; H01L 23/3107;
(Continued)

(56) References Cited

U.S. PATENT DOCUMENTS

2004/0032011 A1* 2/2004 Warner ............. H01L 23/49531
257/676
2014/0374889 A1* 12/2014 Denta ..................... H01L 25/18
257/666
(Continued)

FOREIGN PATENT DOCUMENTS

| JP | H07-050386 A | 2/1995 |
| JP | 2010-118589 A | 5/2010 |
| JP | 2013-197655 A | 9/2013 |

OTHER PUBLICATIONS

International Search Report issued in PCT/JP2020/037425; mailed Dec. 8, 2020.

*Primary Examiner* — Omar F Mojaddedi
(74) *Attorney, Agent, or Firm* — Studebaker Brackett PLLC

(57) ABSTRACT

A semiconductor device (100) according to the present disclosure comprises a semiconductor chip (130) in which are formed a protruding terminal (14) that electrically connects to a transistor (13) and that has a greater cross-sectional area than a bonding wire (4) and a short circuit prevention side wall (15) that is insulating and that covers side surfaces that face the surroundings of the protruding terminal (14). The semiconductor chip (130) is bonded to the upper surface (3) of a metal plate (2) by a conductive bonding material 6. A conductor pattern (34a) that is formed in a circuit board (30) bonded to the upper surface (3) of the metal plate (2) is connected via the bonding wire (4) to the projection-direction end of the protruding terminal (14).

15 Claims, 10 Drawing Sheets

(51) Int. Cl.
- *H01L 23/04* (2006.01)
- *H01L 23/13* (2006.01)
- *H01L 23/495* (2006.01)
- *H01L 23/498* (2006.01)
- *H01L 23/66* (2006.01)

(52) U.S. Cl.
CPC .............. *H01L 23/66* (2013.01); *H01L 24/85* (2013.01); *H01L 2223/6611* (2013.01); *H01L 2223/6644* (2013.01); *H01L 2924/1421* (2013.01)

(58) Field of Classification Search
CPC ........... H01L 23/3121; H01L 23/49513; H01L 23/49838; H01L 23/5226; H01L 23/62; H01L 23/66; H01L 24/45; H01L 24/48; H01L 24/49; H01L 24/85
See application file for complete search history.

(56) References Cited

U.S. PATENT DOCUMENTS

| | | | |
|---|---|---|---|
| 2016/0021754 A1* | 1/2016 | Chen | H01L 25/105 29/841 |
| 2016/0157351 A1* | 6/2016 | Taya | H01L 23/04 361/752 |
| 2018/0343736 A1* | 11/2018 | Sato | H01L 23/3677 |
| 2020/0013750 A1* | 1/2020 | Tsai | H01L 25/105 |
| 2021/0313285 A1* | 10/2021 | Noori | H01L 23/5385 |
| 2022/0014147 A1* | 1/2022 | Tsuruda | H01L 23/66 |
| 2022/0102316 A1* | 3/2022 | Terashima | H01L 25/072 |

* cited by examiner

SEMICONDUCTOR APPARATUS

FIELD

The present disclosure relates to a semiconductor apparatus used for electric power amplification at high frequency.

BACKGROUND

Downsizing and high power of a high-frequency amplifier used at a base station have been required in view of service start of the fifth-generation mobile communication system. As a form of the high-frequency amplifier, the entire RF front-end circuit at the base station tends to be downsized by integrating a high-power transistor, a matching circuit, a functional circuit, and the like into one amplifier module. In addition, it has been discussed that the base station is downsized by reducing the number of antennas by employing the amplifier module with high power.

When the high-power transistor is provided as a module, a mechanism for releasing heat generated at the transistor is needed for the module. The heat-releasing mechanism typically has a structure with which heat is released from the back surface of a semiconductor chip on which the transistor is formed to a package back surface. A plate of a low heat resistance metal is employed as the package back surface to improve heat-releasing performance. For heat resistance reduction, the semiconductor chip is not mounted on a substrate but is directly die-bonded to the metal plate.

From a viewpoint of downsizing of the entire RF front-end circuit, a functional circuit such as a bias control circuit tends to be integrated into the amplifier module in addition to a matching circuit and a bias circuit, which are necessary for amplifier operation. In this case, circuit scale is large and complicated wiring arrangement is needed, but downsizing is achieved by employing a multi-layer structure for a substrate of the amplifier module.

For example, PTL 1 discloses a semiconductor package apparatus including a multi-ceramic-layer substrate in which wires are formed in a multi-layer structure, a metal base having a surface on part of which the multi-ceramic-layer substrate is arranged, at least one semiconductor device arranged on the multi-ceramic-layer substrate, at least one semiconductor device arranged on the metal base, and a lid that seals the semiconductor device on the multi-ceramic-layer substrate and the semiconductor device on the metal base.

For higher power, heat resistance reduction due to thinning of a semiconductor chip for an electric power amplifier arranged on the metal base is effective to achieve efficient heat-releasing from a transistor on a surface of the semiconductor chip. In addition, further layering of a multi-layer substrate is effective for further downsizing.

CITATION LIST

Patent Literature

[PTL 1] JP H7-50386 A

SUMMARY

Technical Problem

However, as a semiconductor chip is thinned for high power, a die bonding material potentially climbs to the upper surface of the semiconductor chip. Silver paste, which is a typical die bonding material of the semiconductor chip, is conductive. Solder, which has a heat resistance lower than that of the silver paste, is a metal and conductive. When the die bonding material reaches a terminal formed on the upper surface of the semiconductor chip, a fatal failure that the terminal is short-circuited to a metal base through the die bonding material occurs.

Increase of the number of layers of a multi-layer substrate typically causes thickening of the substrate, and together with thinning of the semiconductor chip, increases the height difference between the semiconductor chip and the multi-layer substrate. Accordingly, the length of a wire electrically connecting the semiconductor chip and the multi-layer substrate increases. Increase of the wire length leads to inductance component increase and thus degrades high-frequency characteristics, which has been another problem.

The present disclosure is intended to solve the above-described problems and provide a semiconductor apparatus that can avoid a terminal short-circuit defect due to climbing of a die bonding material to the upper surface of a semiconductor chip and can reduce the heat resistance of a transistor even when the semiconductor chip is thinned.

The present disclosure is also intended to provide a semiconductor apparatus that can prevent inductance component increase and suppress degradation of high-frequency characteristics even in a case of wire length increase due to thickening of the substrate or thinning of the semiconductor chip.

Solution to Problem

A semiconductor apparatus according to the present disclosure includes a semiconductor chip including a semiconductor substrate, a transistor, a protrusion terminal, and a short-circuit prevention sidewall, the semiconductor substrate having a first principal surface and a first back surface opposite to each other, the transistor being formed on the first principal surface, the protrusion terminal being formed as a protrusion on the first principal surface and electrically connected to the transistor, the short-circuit prevention sidewall being insulating and provided at a peripheral part of the first principal surface to cover a side surface of the protrusion terminal, the side surface facing circumference of the semiconductor substrate, a circuit substrate having a second principal surface and a second back surface opposite to each other, a conductor pattern being formed on the second principal surface, a metal plate having an upper surface, the first back surface being joined to the upper surface by a conductive joint material, the second back surface being joined to the upper surface and a bonding wire connecting an end part of the protrusion terminal in a protrusion direction and the conductor pattern, wherein the protrusion terminal has a cross-sectional area larger than a cross-sectional area of the bonding wire.

Advantageous Effects of Invention

According to the present disclosure, a protrusion terminal having a cross-sectional area larger than the cross-sectional area of a bonding wire is formed as a protrusion on a principal surface of a semiconductor substrate, and an insulating short-circuit prevention sidewall covers a side surface of the protrusion terminal, the side surface facing circumference of the semiconductor substrate. In addition, a bonding wire connects an end part of the protrusion terminal in a protrusion direction and a conductor pattern formed on a circuit substrate.

Thus, even when the semiconductor substrate is thinned, it is possible to avoid a terminal short-circuit defect due to climbing of a die bonding material to the principal surface of the semiconductor substrate. Accordingly, it is possible to reduce the heat resistance of a transistor.

Moreover, it is possible to prevent inductance component increase even when the wire length increases due to thickening of the circuit substrate or thinning of the semiconductor chip, and thus it is possible to provide a semiconductor apparatus with suppressed degradation of high-frequency characteristics.

DESCRIPTION OF EMBODIMENTS

Figure 1A:
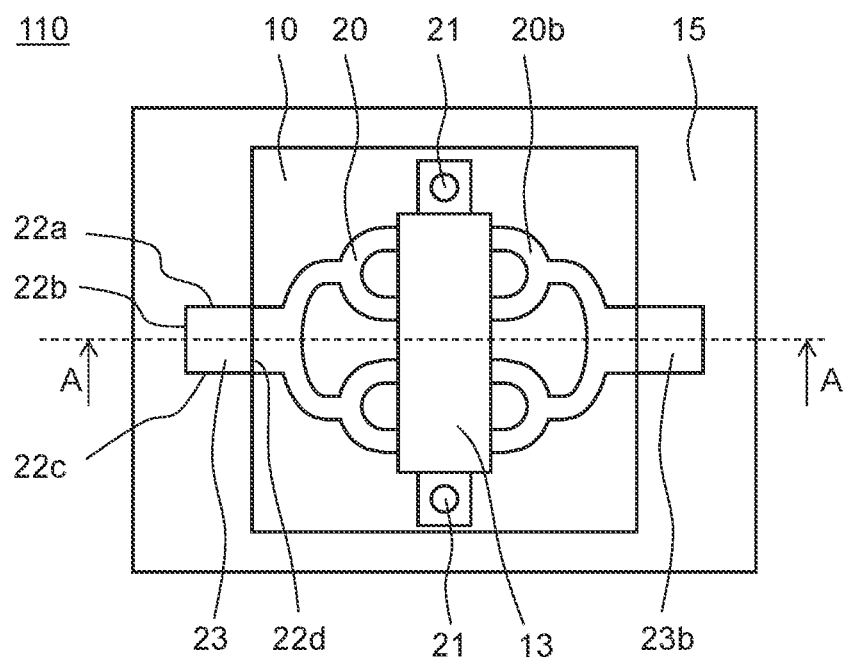
FIG. 1A is a plan view of the semiconductor chip 110 according to the first embodiment.

Semiconductor apparatuses according to embodiments of the present disclosure are described with reference to drawings. Identical or corresponding constitutional elements are given the same reference numerals, and the repeated description of such constitutional elements may be omitted.

First Embodiment

A semiconductor chip 110 according to a first embodiment of the present disclosure will be described below.

Figure 1B:
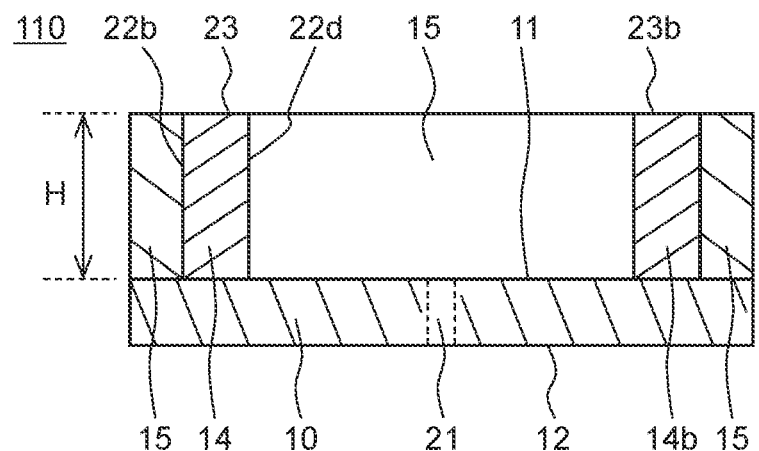
FIG. 1B is a sectional diagram of the semiconductor chip 110 according to the first embodiment.

FIG. 1 illustrates a plan view and a sectional diagram of the semiconductor chip 110 according to the first embodiment of the present disclosure. FIG. 1 (a) is a plan view of the semiconductor chip 110 when viewed from top, and FIG. 1 (b) is a cross-sectional view of the semiconductor chip 110 when viewed from a position A-A in FIG. 1 (a).

The semiconductor chip 110 includes a semiconductor substrate 10, a transistor 13, a protrusion terminal 14, and a short-circuit prevention sidewall 15.

The semiconductor substrate 10 has a first principal surface 11 and a first back surface 12 opposite to the first principal surface 11. In the semiconductor substrate 10, a nitride semiconductor containing gallium nitride (GaN) is stacked on a silicon carbide (SiC) substrate. The thickness of the semiconductor substrate 10 is 50 μm and thinner than the thickness of a typical semiconductor substrate, which is approximately 100 μm.

The transistor 13 that amplifies electric power at high frequency and matching circuits 20 and 20b are formed on the first principal surface 11 of the semiconductor substrate 10. The matching circuits 20 and 20b are formed of a microstrip line.

The transistor 13 is schematically illustrated in FIG. 1 (a). The transistor 13 and the matching circuits 20 and 20b are not illustrated in FIG. 1 (b) and any other cross-sectional view to be described later The transistor 13 is a multi-finger high electron mobility transistor (HEMT). The transistor 13 includes a gate, a drain, and a source.

The source of the transistor 13 is connected to a metal film that blocks an opening of a via hole 21 formed through the semiconductor substrate 10, the opening being positioned on the first principal surface 11 side. The metal film is connected to a multi-layered film made of a plurality of metals and formed on a side surface of the via hole 21. The multi-layered film is connected to a metal thin film (not illustrated) formed on substantially the entire surface of the first back surface 12. In other words, the source of the transistor 13 is connected to the metal thin film, and the metal thin film functions as a ground (GND) electrode of the semiconductor chip 110.

The gate of the transistor 13 is connected to the matching circuit 20, and the matching circuit 20 is connected to the protrusion terminal 14. In other words, the gate of the transistor 13 is electrically connected to the protrusion terminal 14.

The drain of the transistor 13 is connected to the matching circuit 20b, and the matching circuit 20b is connected to a protrusion terminal 14b. In other words, the drain of the transistor 13 is electrically connected to the protrusion terminal 14b.

The protrusion terminals 14 and 14b are each a rectangular column having a square bottom surface and formed as an upward protrusion on the first principal surface 11 of the semiconductor substrate 10. The protrusion terminals 14 and 14b each have a height H of 250 μm. The material of the protrusion terminals 14 and 14b is gold.

Bottom surfaces of the protrusion terminals 14 and 14b, which contact the first principal surface 11 are each a square with sides having a length of 100 μm. Their opposite bottom surfaces, in other words, a bottom surface of the protrusion terminal 14 at an end part 23 in the protrusion direction and a bottom surface of the protrusion terminal 14b at an end part 23b in the protrusion direction are each a square with sides having a length of 100 μm. The bottom surface of the protrusion terminal 14 at the end part 23 in the protrusion direction and the bottom surface of the protrusion terminal 14b at the end part 23b in the protrusion direction are formed flat to such an extent that wire bonding is possible. A square with sides having a length of 100 μm is equivalent to the dimension of a bonding pad applied to a gold wire having a diameter of 25 μm.

The protrusion terminal 14 has four side surfaces 22a, 22b, 22c, and 22d. The side surfaces 22a, 22b, and 22c face circumference of the semiconductor chip 110, and the side surface 22d faces the inside of the semiconductor chip 110.

Note that the protrusion terminals 14 and 14b in the present disclosure are each a rectangular column but may be each a polygonal column or a cylinder. Alternatively, the protrusion terminals 14 and 14b may be each formed of a stud bump or the like or may each a multi-layer structure.

The short-circuit prevention sidewall 15 is provided around a peripheral part of the first principal surface 11 of the semiconductor substrate 10 without discontinuity. The short-circuit prevention sidewall 15 has a height H of 250 μm. The material of the short-circuit prevention sidewall 15 is polyimide. Alternatively, the material may be, for example, SiN, SiON, or benzocyclobutene (BCB). In other words, the short-circuit prevention sidewall 15 is insulating. The short-circuit prevention sidewall 15 may be a multi-layer structure.

The short-circuit prevention sidewall 15 covers the three side surfaces 22a, 22b, and 22c of the protrusion terminal 14, which face circumference of the semiconductor substrate 10.

The short-circuit prevention sidewall 15 does not cover the side surface 22d of the protrusion terminal 14, which faces the inside of the semiconductor substrate 10. High-frequency gain decreases due to parasitic capacitance increase when the transistor 13 is covered by a dielectric. Thus, an upper surface of the transistor 13 is not covered by the short-circuit prevention sidewall 15. The bottom surface of the protrusion terminal 14 at the end part 23 in the protrusion direction is not covered by the short-circuit prevention sidewall 15 but is exposed. The short-circuit prevention sidewall 15 does not cover upper surfaces of the matching circuits 20 and 20b.

The protrusion terminal 14 connected to the gate of the transistor 13 is described above. The same description of the protrusion terminal 14 applies to the protrusion terminal 14b connected to the drain of the transistor 13. Specifically, the short-circuit prevention sidewall 15 covers three side surfaces of the protrusion terminal 14b, the side surfaces facing circumference of the semiconductor substrate 10, but does not cover a side surface of the protrusion terminal 14b, the side surface facing the inside of the semiconductor substrate 10. The bottom surface of the protrusion terminal 14b at the end part 23b in the protrusion direction is not covered by the short-circuit prevention sidewall 15 but is exposed.

In the following description, for example, the circuit board 30 and the like have the same structures on the drain side and on the gate side except for circuit constant difference and the like. Thus, duplicate description of the drain-side structure to description of the gate-side structure is omitted as appropriate below.

A process of forming the protrusion terminals 14 and 14b will be described below.

First, the transistor 13, the matching circuit 20, the via hole 21, and the like are formed on the semiconductor substrate 10. Subsequently, the first principal surface 11 of the semiconductor substrate 10 is covered by a resist. Subsequently, the resist at parts where the protrusion terminals 14 and 14b are to be provided is removed and opened. Subsequently, evaporation coating with an underlaying metal is performed and a thick resist is applied. The thick resist is opened at parts where the protrusion terminals 14 and 14b are to be provided, and accordingly, the underlaying metal is exposed. Subsequently, gold is grown at the opened parts by electrolytic plating. Lastly, the gold, the resist, and the underlaying metal at any unnecessary part are removed to form the protrusion terminals 14 and 14b.

A process of forming the short-circuit prevention sidewall 15 will be described below.

A sheet of polyimide is laminated on the first principal surface 11 side of the semiconductor substrate 10. Subsequently, the polyimide is pressurized to contact the semiconductor substrate 10 and fill irregularities of a structure formed on the first principal surface 11 of the semiconductor substrate 10. Subsequently, any necessary part is masked and any unnecessary part is exposed to light, and then the unnecessary part is developed and removed. Subsequently, the remaining necessary part is heated (cured) to form the short-circuit prevention sidewall 15.

Figure 2:
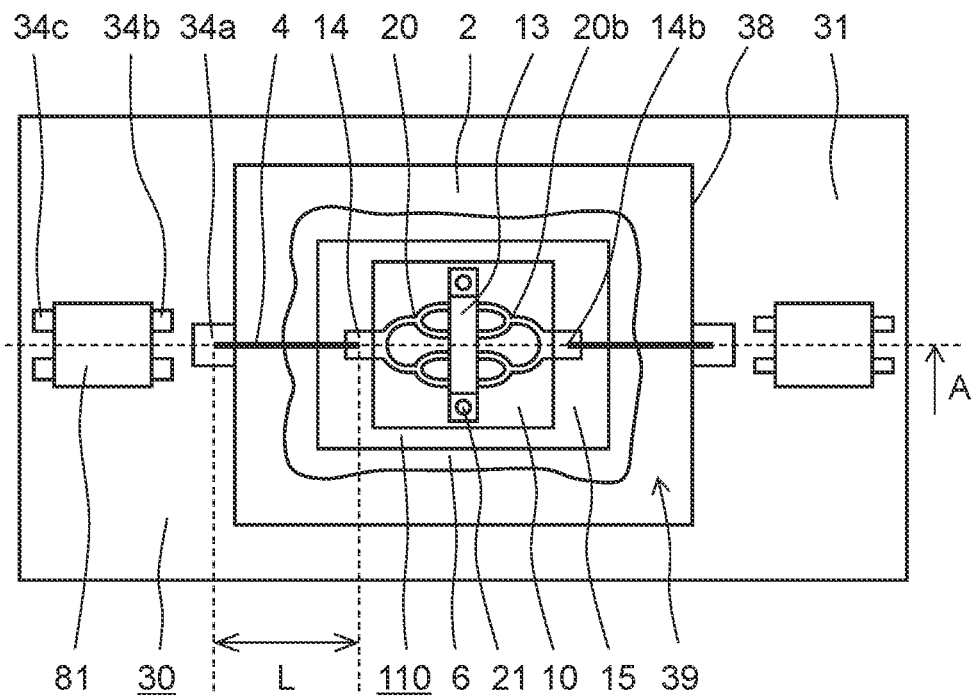
FIG. 2 is a plan view of a semiconductor apparatus 100 according to the first embodiment.
Figure 3:
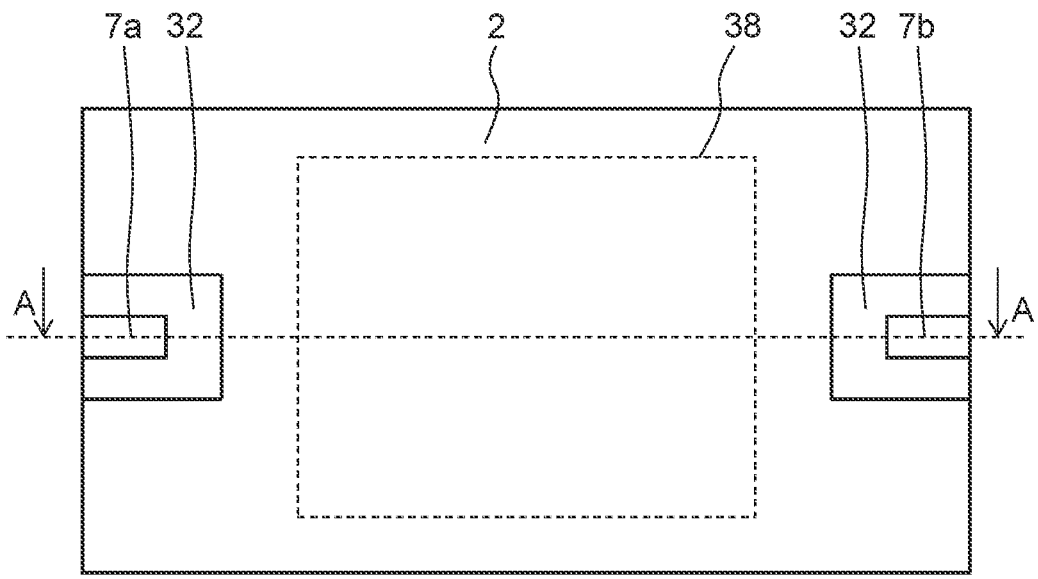
FIG. 3 is a bottom view of the semiconductor apparatus 100 according to the first embodiment.
Figure 4:
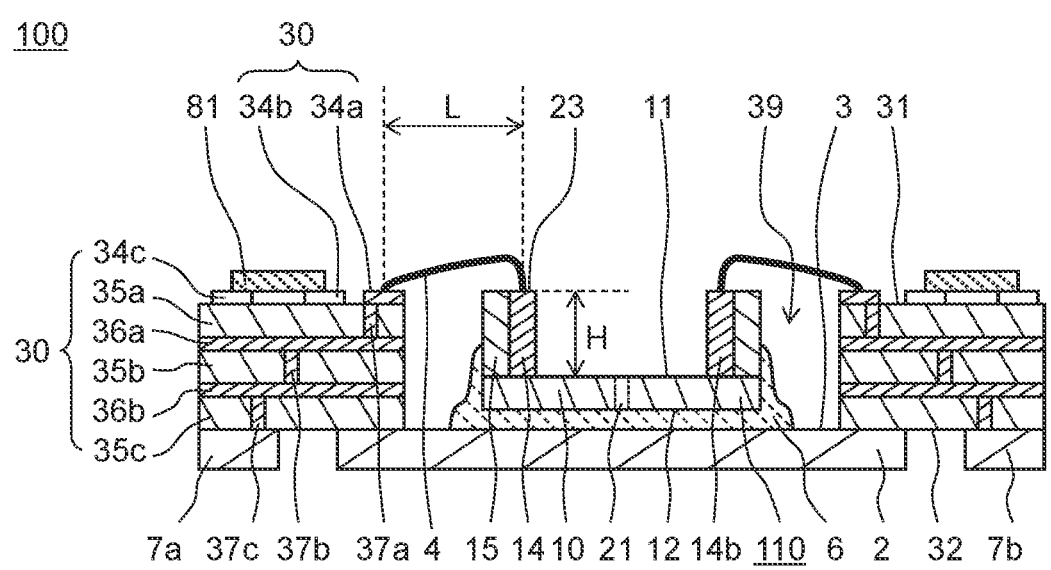
FIG. 4 is a cross-sectional view of the semiconductor apparatus 100 according to the first embodiment.

FIG. 2 is a plan view of a semiconductor apparatus 100 according to the first embodiment, and FIG. 3 is a bottom view of the semiconductor apparatus 100 according to the first embodiment. FIG. 4 is a cross-sectional view of the semiconductor apparatus 100 according to the first embodiment. FIG. 4 illustrates a section viewed from a position A-A in FIG. 2.

The semiconductor apparatus 100 includes the semiconductor chip 110, the circuit substrate 30, a metal plate 2, and a bonding wire 4.

The circuit substrate 30 is a multi-layer printed wiring board. The thickness of the circuit substrate 30 is 300 μm. An upper surface of the circuit substrate 30, in other words, a surface thereof on an insulating layer 35a side is a second principal surface 31. A lower surface of the circuit substrate 30, in other words, a surface thereof on an insulating layer 35c side is a second back surface 32. The second principal surface 31 and the second back surface 32 are opposite to each other.

Conductor patterns 34a, 34b, and 34c as a surface conductor layer are provided on the second principal surface 31 of the circuit substrate 30. The circuit substrate 30 includes the insulating layers 35a, 35b, and 35c. The material of the insulating layers 35a to 35c is, for example, glass epoxy resin, thermosetting resin, or fluorine resin.

The circuit substrate 30 includes inner layers 36a and 36b as an inner conductor pattern layer.

The conductor patterns 34a to 34c, the inner layers 36a and 36b, the metal plate 2, an input terminal 7a, and an output terminal 7b are connected to each other through a via hole in accordance with designing of the semiconductor apparatus 100.

For example, in FIG. 4, the conductor pattern 34a and the inner layer 36a are electrically connected through a via hole 37a penetrating through the insulating layer 35a. The inner layer 36a and the inner layer 36b are electrically connected through a via hole 37b penetrating through the insulating layer 35b. The inner layer 36b and the input terminal 7a are electrically connected through a via hole 37c penetrating through the insulating layer 35c.

An electronic component 81 is mounted on and connected to the conductor patterns 34b and 34c. The electronic component 81 is, for example, an IC chip or a surface mounted component. A plurality of electronic components 81 may be provided.

The metal plate 2, the input terminal 7a, and the output terminal 7b are metal thin plates made of copper and having a thickness of 0.2 mm. An upper surface 3 of the metal plate 2, the input terminal 7a, and the output terminal 7b are joined to the second back surface 32 of the circuit substrate 30. The metal plate 2 is separated from each of the input terminal 7a and the output terminal 7b. Each separation part can be easily formed by etching or drilling a desired region. As described later, the metal plate 2 is a ground (GND) terminal when the semiconductor apparatus 100 is mounted on a high-frequency amplifier. Lower surfaces of the metal plate 2, the input terminal 7a, and the output terminal 7b are flat to such an extent that the semiconductor apparatus 100 can be mounted on a high-frequency amplifier.

A through-hole 38 penetrating through the circuit substrate 30 is formed at a middle part of the circuit substrate 30 in a plan view. The second back surface 32 side of the through-hole 38 is covered by the metal plate 2. A corresponding part of the circuit substrate 30 to the through-hole 38 forms a cavity part 39 that is recessed when viewed from above.

The semiconductor chip 110 is mounted at the cavity part 39 of the circuit substrate 30. Specifically, the first back surface 12 of the semiconductor substrate 10 included in the semiconductor chip 110 is joined to the upper surface 3 of the metal plate 2 at the cavity part 39 by using a conductive joint material 6.

Specific examples of the joint material 6 are conductive epoxy resin typically called silver paste, sintered silver paste having a thermal conductivity higher than that of typical silver paste, and soldering.

From a viewpoint of heat-releasing of the semiconductor apparatus 100, the thermal conductivity of the joint material 6 is preferably high and the thickness of the joint material 6 is preferably thin.

The bottom surface of the protrusion terminal 14 at the end part 23 in the protrusion direction and the conductor pattern 34a are connected through the bonding wire 4. In other words, the end part of the protrusion terminal 14 in the protrusion direction and the conductor pattern 34a are connected through the bonding wire 4. Since the conductor pattern 34a and the input terminal 7a are connected, the gate of the transistor 13 and the input terminal 7a are connected. Similarly, the drain of the transistor 13 and the output terminal 7b are connected. The bonding wire 4 has a length L of 500 μm in the horizontal direction, The semiconductor apparatus 100 is used in a high-frequency amplifier at a base station of the fifth-generation mobile communication system. In case of use, the lower surface of the metal plate 2 is connected to a ground (GND) of the high-frequency amplifier. The lower surface of the metal plate 2 is a ground terminal of the semiconductor apparatus 100. As described above, the source of the transistor 13 is connected to the metal thin film (not illustrated) formed on substantially the entire surface of the first back surface 12 through the via hole 21. Accordingly, the source of the transistor 13 is electrically connected to the metal plate 2. Since the source of the transistor 13 is connected to the metal plate 2 through the via hole 21, the source inductance of the transistor 13 is reduced and high-frequency characteristics of the transistor 13 are improved.

The input terminal 7a and the output terminal 7b are each connected to the high-frequency amplifier. The frequency band of a high-frequency signal input to the input terminal 7a has, for example, a band number of n77 (n78) (=3.6 GHz to 4.2 GHz) or n79 (=4.4 GHz to 4.9 GHz). The input high-frequency signal is amplified by the transistor 13 and output from the output terminal 7b. The maximum electric power of the output high-frequency signal is approximately 10 W. The semiconductor apparatus 100 may be mounted on a surface of the high-frequency amplifier.

Note that the semiconductor apparatus 100 may include, in addition to the input terminal 7a and the output terminal 7b, various terminals such as a bias terminal and a control signal input-output terminal.

The transistor 13 provided on the first principal surface 11 of the semiconductor substrate 10 generates heat when operated. The generated heat is conducted from the first principal surface 11 to the metal plate 2 through the semiconductor substrate 10 and the joint material 6. The heat conducted to the metal plate 2 is further conducted to the high-frequency amplifier and externally discharged from the high-frequency amplifier. The metal plate 2 is also a heat-releasing terminal of the semiconductor apparatus 100. From a viewpoint of heat-releasing of the semiconductor apparatus 100, the thermal conductivity of the semiconductor substrate 10 is preferably high and the thickness of the semiconductor substrate 10 is preferably thin.

Operations and effects of the protrusion terminal 14 will be described below. As described above, the wire inductance component increases as the wire length of the bonding wire 4 increases, and high-frequency characteristics degrade, which has been a problem.

In the first embodiment, the thickness of the circuit substrate 30 is set to 300 μm, the thickness of the semiconductor substrate 10 is set to 50 μm, and the height of the protrusion terminal 14 is set to 250 μm, and accordingly, the height difference between the second principal surface 31 of the circuit substrate 30 and the end part 23 of the protrusion terminal 14 is 0 μm. The matching circuit 20 and the conductor pattern 34a are connected through the bonding wire 4 having a starting point and an end point separated from each other by 500 μm in the horizontal direction and having a height difference of 0 μm and through the protrusion terminal 14 having a height of 250 μm.

When it is assumed that the protrusion terminal 14 is not provided, the matching circuit 20 and the conductor pattern 34a are connected through a bonding wire having a starting point and an end point separated from each other by 500 μm in the horizontal direction and by 250 μm in the height direction. Thus, the bonding wire 4 can be shortened by providing the protrusion terminal 14.

An inductance component that affects high-frequency characteristics is generated at the protrusion terminal 14 as well.

The bonding wire 4 has a diameter of 25 μm and a cross-sectional area of approximately 490 μm², and the protrusion terminal 14 is a rectangular column with sides having a length of 100 μm and has a cross-sectional area of 10000 μm. The length of the protrusion terminal 14 is half of that of the bonding wire 4, and the cross-sectional area of the protrusion terminal 14 is about 20 times larger than the cross-sectional area of the bonding wire 4. Accordingly, the inductance component of the protrusion terminal 14 is negligibly small as compared to the inductance component of the bonding wire 4.

Thus, in a case in which the protrusion terminal 14 is provided, the wire length of the bonding wire 4 is shortened as compared to a case in which the conductor pattern 34a and the first principal surface 11 are connected without the protrusion terminal 14. Although an inductance component is generated at the protrusion terminal 14, the inductance component of the protrusion terminal 14 per length is smaller than the inductance component of the bonding wire 4 per length since the cross-sectional area of the protrusion terminal 14 is set to be larger than the cross-sectional area of the bonding wire 4. Thus, it is possible to prevent inductance component increase when the height difference increases due to thickening of the circuit substrate 30 or thinning of the semiconductor substrate 10.

In other words, it is possible to decrease an inductance component that would cause degradation of high-frequency characteristics, thereby preventing degradation of high-frequency characteristics.

Subsequently, operations and effects of the short-circuit prevention sidewall 15 will be described below.

Typically, the semiconductor substrate 10 has a thickness of approximately 100 μm. When the thickness is reduced to 50 μm for heat resistance reduction, the semiconductor substrate 10 is embedded in the joint material 6 at die bonding, and the joint material 6 climbs to the first principal surface of the semiconductor substrate 10. Connection between the semiconductor chip and an external circuit is normally achieved by connecting a bonding pad provided at a periphery of the semiconductor substrate to the external circuit through a bonding wire, and thus a failure that the metal plate 2 and the bonding wire are electrically connected through the joint material 6 occurs first. When the degree of climbing is high, a failure of electrical connection to the matching circuit, the transistor, and the like provided at a middle part of the semiconductor substrate potentially occurs.

However, in the first embodiment, the protrusion terminal 14 is provided as a protrusion on the first principal surface 11 of the semiconductor substrate 10, and the short-circuit prevention sidewall 15 covers a side surface of the protrusion terminal 14, the side surface facing circumference. Since the short-circuit prevention sidewall 15 is insulating, the protrusion terminal 14 is not electrically connected to the metal plate 2 even when the conductive joint material 6 contacts the short-circuit prevention sidewall 15. Moreover, since the bonding wire 4 connects the end part 23 of the protrusion terminal 14 and the conductor pattern 34a as the surface conductor layer of the circuit substrate 30, the bonding wire 4 is not electrically connected to the metal plate 2.

Thus, it is possible to avoid a terminal short-circuit defect due to climbing of the joint material 6 to the first principal surface 11 of the semiconductor substrate 10 even when the semiconductor substrate 10 is thinned. Accordingly, it is possible to reduce the heat resistance of the transistor 13.

In addition, the short-circuit prevention sidewall 15 in the first embodiment is provided around the peripheral part of the first principal surface 11 of the semiconductor substrate 10 without discontinuity. Accordingly, it is also possible to prevent a failure that the joint material 6 reaches and is electrically connected to the matching circuit, the transistor, and the like provided at the middle part of the semiconductor substrate 10.

As described above, the semiconductor apparatus 100 according to the first embodiment of the present disclosure includes the semiconductor chip 110 including the semiconductor substrate 10, the transistor 13, the protrusion terminal 14, and the short-circuit prevention sidewall 15, the semiconductor substrate 10 having the first principal surface 11 and the first back surface 12 opposite to each other, the transistor 13 being formed on the first principal surface 11, the protrusion terminal 14 being formed as a protrusion on the first principal surface 11 and electrically connected to the transistor 13, the short-circuit prevention sidewall 15 being insulating and provided at the peripheral part of the first principal surface 11 to cover the side surfaces 22a, 22b, and 22c of the protrusion terminal 14, the side surfaces 22a, 22b, and 22c facing circumference of the semiconductor substrate 10.

The semiconductor apparatus 100 also includes the circuit substrate 30 having the second principal surface 31 and the second back surface 32 opposite to each other, the conductor pattern 34a being formed on the second principal surface 31; the metal plate 2 having the upper surface 3 to which the first back surface 12 and the second back surface 32 are joined by the conductive joint material 6; and the bonding wire 4 connecting the end part 23 of the protrusion terminal 14 in the protrusion direction and the conductor pattern 34a.

The protrusion terminal 14 has a cross-sectional area larger than the cross-sectional area of the bonding wire 4. Moreover, the short-circuit prevention sidewall 15 is provided around the peripheral part of the first principal surface 11 of the semiconductor substrate 10 without discontinuity.

With such a configuration, it is possible to avoid a short-circuit defect due to climbing of the joint material 6 to the first principal surface 11 of the semiconductor substrate 10 even when the semiconductor substrate 10 is thinned. Accordingly, it is possible to reduce the heat resistance of the transistor 13. Moreover, it is possible to prevent inductance component increase even when the length of the bonding wire 4 increases due to thickening of the circuit substrate 30 or thinning of the semiconductor chip, and thus it is possible to provide a semiconductor apparatus with suppressed degradation of high-frequency characteristics.

In addition, since the bonding wire 4 is shortened, it is possible to increase maximum allowable current that can flow through the bonding wire 4 and apply a semiconductor chip with higher power. Inductance component decrease leads to circuit designing easiness.

In addition, with thinning of the semiconductor substrate 10, it is possible to shorten a fabrication time for the via hole 21, thereby improving the throughput of a process of fabricating the semiconductor chip 110. The aspect ratio of the via hole 21, in other words, the ratio of the hole depth relative to the hole diameter can be decreased, and thus the fabrication yield of the via hole 21 can be improved. Since the heat resistance of the transistor 13 can be reduced, a transistor with higher power can be applied.

In addition, even when the line width of the microstrip line forming the matching circuits 20 and 20b is narrowed as the semiconductor substrate 10 is thinned, the microstrip line can achieve the same line impedance as before the thinning. Accordingly, it is possible to scale down wiring arrangement on the semiconductor substrate 10, thereby downsizing the semiconductor chip 110.

Second Embodiment

In the first embodiment, the semiconductor chip 110 and the like are exposed. However, a normal semiconductor apparatus is sealed by some method to protect the semiconductor chip 110 and the like from vibration and impact from outside and water and dust in air and provide handling easiness. A second embodiment is an example of performing sealing with molding resin, which is a most typical sealing method.

A semiconductor apparatus 200 according to the second embodiment includes a cap substrate 50a in addition to the semiconductor chip 110, the circuit substrate 30, the metal plate 2, and the bonding wire 4.

Figure 5A:
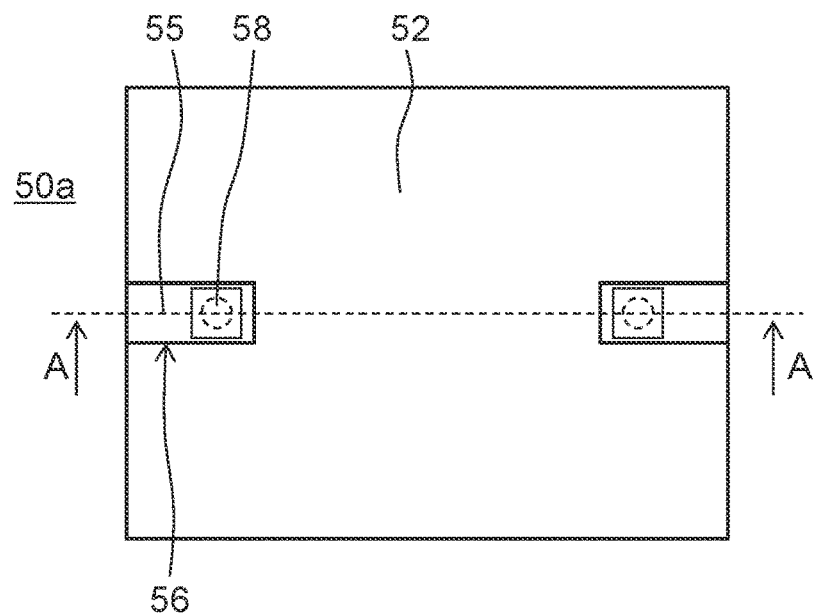
FIG. 5A is a plan view of the cap substrate 50a according to the second embodiment.
Figure 5B:
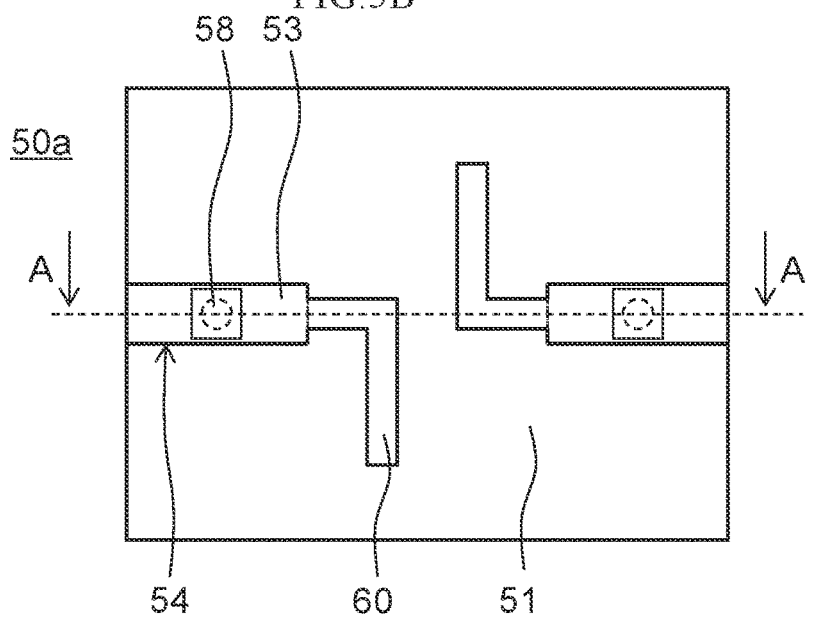
FIG. 5B is a bottom view of the cap substrate 50a according to the second embodiment.
Figure 5C:
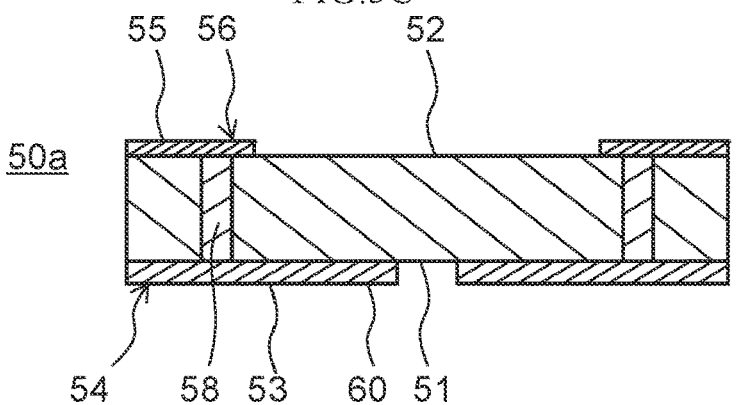
FIG. 5C is a sectional diagram of the cap substrate 50a according to the second embodiment.

FIG. 5 illustrates a plan view, a bottom view, and a sectional diagram of the cap substrate 50a according to the second embodiment of the present disclosure. FIG. 5 (a) is a plan view of the cap substrate 50a when viewed from top, FIG. 5 (b) is a bottom view of the cap substrate 50a when viewed from below, and FIG. 5 (c) is a cross-sectional view of the cap substrate 50a when viewed from a position A-A in FIG. 5 (a).

The cap substrate 50a has a third principal surface 51 and a third back surface 52 opposite to the third principal surface 51. A first wire 54 is provided on the third principal surface 51 of the cap substrate 50a. The first wire 54 includes a pad 53. A second wire 56 is provided on the third back surface 52 of the cap substrate 50a. The second wire 56 includes a pad 55.

The first wire 54 is electrically connected to a via hole 58. The via hole 58 penetrates through the cap substrate 50a. The second wire 56 is electrically connected to the via hole 58. Accordingly, the first wire 54 is electrically connected to the second wire 56.

A circuit pattern 60 is provided on the third principal surface 51 and electrically connected to the first wire 54. Accordingly, the circuit pattern 60 is electrically connected to the transistor 13. In the second embodiment, the circuit pattern 60 is an open stub and functions as a matching circuit that contributes to fundamental wave matching. Alternatively, the circuit pattern 60 may be a harmonic processing circuit that performs harmonic matching.

The cap substrate 50a is a thin plate made of ceramic with a low loss at high frequency, such as alumina or low temperature co-fired ceramics (LTCC). Alternatively, the cap substrate 50a may be a semi-insulating gallium arsenic substrate or a high-resistance silicon substrate.

Figure 6A:
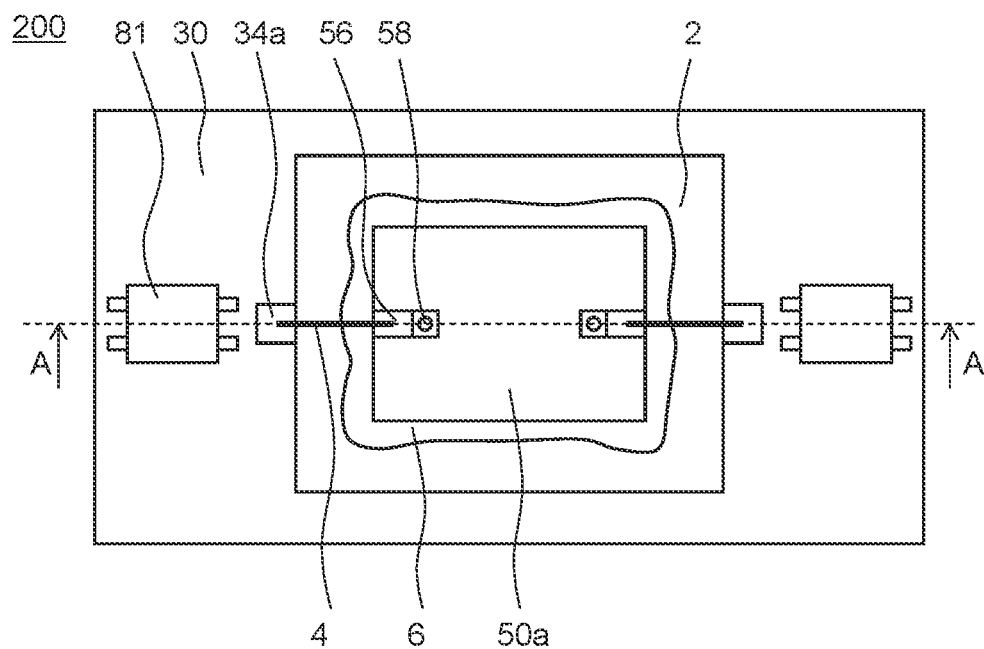
FIG. 6A is a plan view of the semiconductor apparatus 200 according to the second embodiment.
Figure 6B:
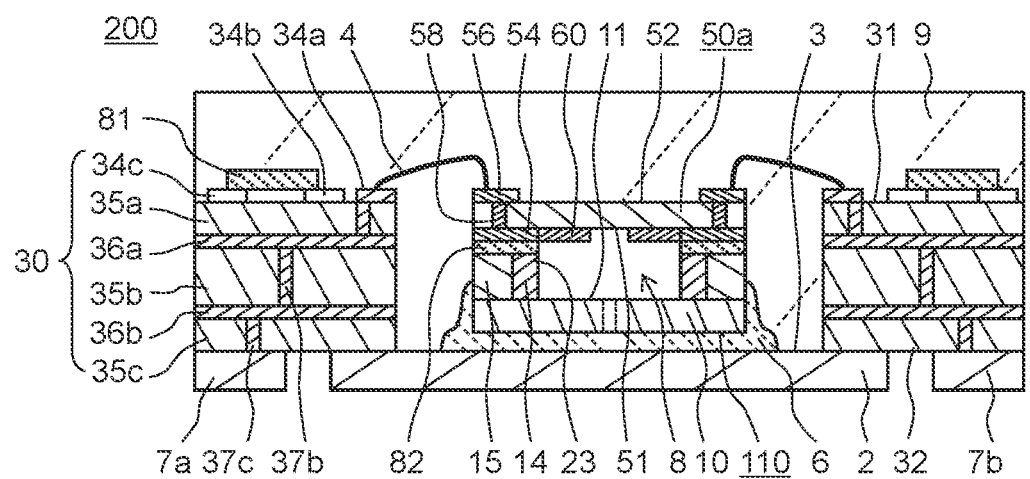
FIG. 6B is a sectional diagram of the semiconductor apparatus 200 according to the second embodiment.

FIG. 6 illustrates a plan view and a sectional diagram of the semiconductor apparatus 200 according to the second embodiment. FIG. 6 (a) is a plan view of the semiconductor apparatus 200 when viewed from top. However, a molding material 9 is not illustrated in FIG. 6 a). FIG. 6 (b) is a cross-sectional view of the semiconductor apparatus 200 when viewed from a position A-A in FIG. 6 (a).

The cap substrate 50a is joined to the protrusion terminal 14 and the short-circuit prevention sidewall 15 through an anisotropic conductive film 82. The third principal surface 51 of the cap substrate 50a faces the first principal surface 11 of the semiconductor substrate 10. In other words, the third principal surface 51 faces the first principal surface 11 through the short-circuit prevention sidewall 15.

As in the first embodiment, the short-circuit prevention sidewall 15 is provided around the peripheral part of the first principal surface 11 without discontinuity. The cap substrate 50a and the short-circuit prevention sidewall 15 are joined through the anisotropic conductive film 82 without a gap. As a result, a hollow space 8 positioned adjacent to the first principal surface 11 and the third principal surface 51 and surrounded and encapsulated by the semiconductor substrate 10, the short-circuit prevention sidewall 15, and the cap substrate 50a is formed above the first principal surface 11 of the semiconductor substrate 10.

An upper part of the semiconductor apparatus 200 is sealed by the molding material 9. The semiconductor substrate 10, the short-circuit prevention sidewall 15, and the cap substrate 50a forming the hollow space 8 are also sealed by the molding material 9. Since the hollow space 8 is encapsulated, the molding material 9 does not enter the hollow space 8 at mold sealing of the semiconductor apparatus 200. In other words, the semiconductor apparatus 200 has a hollow structure, and the first principal surface 11 and the third principal surface 51 are adjacent to the hollow structure.

The bottom surface of the protrusion terminal 14 at the end part 23 in the protrusion direction and the pad 53 (not illustrated) of the first wire 54 are arranged over each other in a plan view and electrically connected through the anisotropic conductive film 82. The pad 55 (not illustrated) of the second wire 56 and the conductor pattern 34a are electrically connected through the bonding wire 4.

Note that, in the second embodiment, the cap substrate 50a and each of the protrusion terminal 14 and the short-circuit prevention sidewall 15 are joined through the anisotropic conductive film 82 but may be joined through, for example, anisotropic conductive paste.

The other part is the same as in the first embodiment, and description thereof is omitted.

As described above, the semiconductor apparatus 200 according to the second embodiment of the present disclosure includes the semiconductor chip 110 including the semiconductor substrate 10, the transistor 13, the protrusion terminal 14, the short-circuit prevention sidewall 15, the semiconductor substrate 10 having the first principal surface 11 and the first back surface 12 opposite to each other, the transistor 13 being formed on the first principal surface 11, the protrusion terminal 14 being formed as a protrusion on the first principal surface 11, electrically connected to the transistor 13, and having a cross-sectional area larger than the cross-sectional area of the bonding wire 4, the short-circuit prevention sidewall 15 being insulating and provided at the peripheral part of the first principal surface 11 to cover the side surfaces 22a, 22b, and 22c of the protrusion terminal 14, the side surfaces 22a, 22b, and 22c facing circumference of the semiconductor substrate 10.

The semiconductor apparatus 200 also includes the circuit substrate 30, the metal plate 2, the cap substrate 50a, and the bonding wire 4, the circuit substrate 30 having the second principal surface 31 and the second back surface 32 opposite to each other, the conductor pattern 34a being formed on the second principal surface 31, the metal plate 2 having the upper surface 3 to which the first back surface 12 and the second back surface 32 are joined by the conductive joint material 6, the cap substrate 50a having the third principal surface 51 and the third back surface 52 opposite to each other, the third principal surface 51 facing the first principal surface 11 through the short-circuit prevention sidewall 15 and being joined to the short-circuit prevention sidewall 15, the first wire 54 being formed on the third principal surface 51 and electrically connected to the bottom surface of the end part of the protrusion terminal 14 in the protrusion direction, the second wire 56 being formed on the third back surface 52 and electrically connected to the first wire 54 through the via hole 58, the bonding wire 4 connecting the second wire 56 and the conductor pattern 34a.

The short-circuit prevention sidewall 15 is provided around the peripheral part of the first principal surface 11 of the semiconductor substrate 10 without discontinuity. The semiconductor substrate 10, the short-circuit prevention sidewall 15, and the cap substrate 50a form the encapsulated hollow space 8 adjacent to the first principal surface 11 and the third principal surface 51. The semiconductor substrate 10, the short-circuit prevention sidewall 15, and the cap substrate 50a forming the hollow space 8 are sealed by the molding material 9. The matching circuit connected to the transistor 13 is provided on the third principal surface 51 of the cap substrate 50*a*.

With such a configuration, similarly to the semiconductor apparatus 100 described in the first embodiment, it is possible to avoid a short-circuit defect due to climbing of the joint material 6 to the first principal surface 11 of the semiconductor substrate 10 when the semiconductor substrate 10 is thinned. Accordingly, it is possible to reduce the heat resistance of the transistor 13. Moreover, it is possible to prevent inductance component increase even when the wire length increases due to thickening of the circuit substrate 30 or thinning of the semiconductor chip, and thus it is possible to provide a semiconductor apparatus with suppressed degradation of high-frequency characteristics.

In addition, it is possible to downsize the semiconductor apparatus 200 since the matching circuit is formed on the third principal surface 51 of the cap substrate 50*a* in the semiconductor apparatus 200. Since the hollow structure with which the matching circuit does not contact the molding material 9 is provided, there is no loss at high frequency due to the molding material 9 unlike a case in which the hollow structure is not provided, and thus it is possible to avoid degradation of characteristics of the matching circuit. Since the hollow structure with which the transistor 13 does not contact the molding material 9 is provided, the parasitic capacitance component of the transistor 13 does not increase unlike a case in which the hollow structure is not provided, and thus it is possible to avoid degradation of characteristics of the transistor 13. Since the hollow structure with which the transistor 13 does not contact the molding material 9 is provided, it is possible to rise channel temperature of the transistor 13 irrespective of glass transition temperature of the molding material 9, thereby achieving the semiconductor apparatus 200 with higher power.

Note that a matching circuit electrically connected to the second wire 56 and connected to the transistor 13 may be provided on the third back surface 52. With the matching circuit provided in this manner, as well, it is possible to downsize the semiconductor apparatus 200.

Third Embodiment

A semiconductor chip 130 according to a third embodiment of the present disclosure will be described below.

Figure 7A:
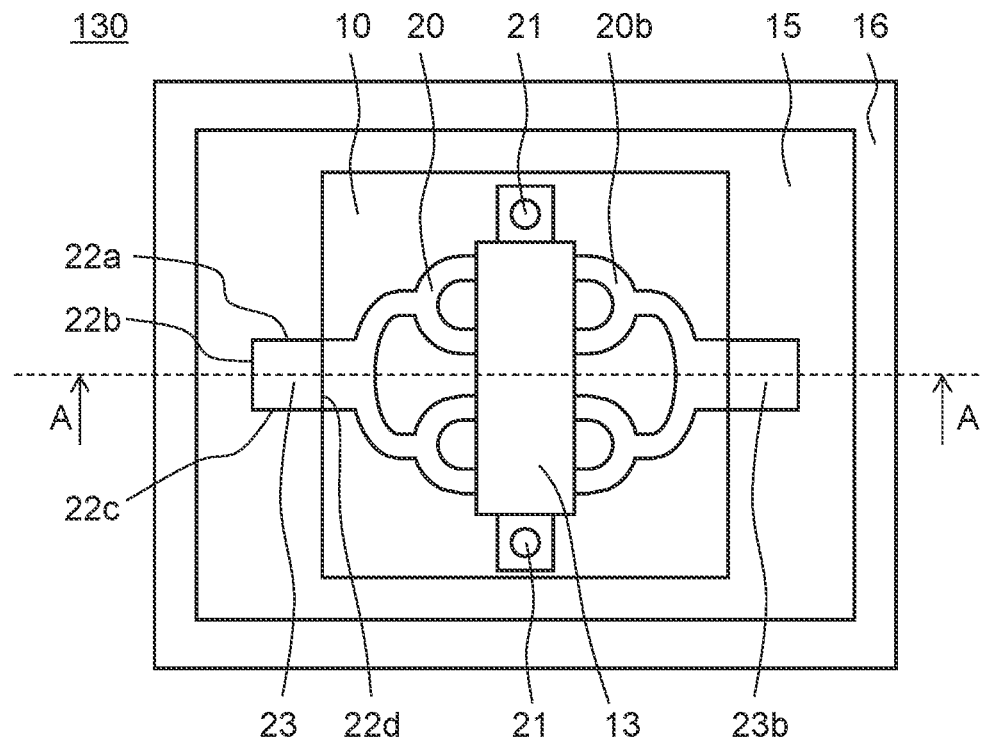
FIG. 7A is a plan view of the semiconductor chip 130 according to the third embodiment.
Figure 7B:
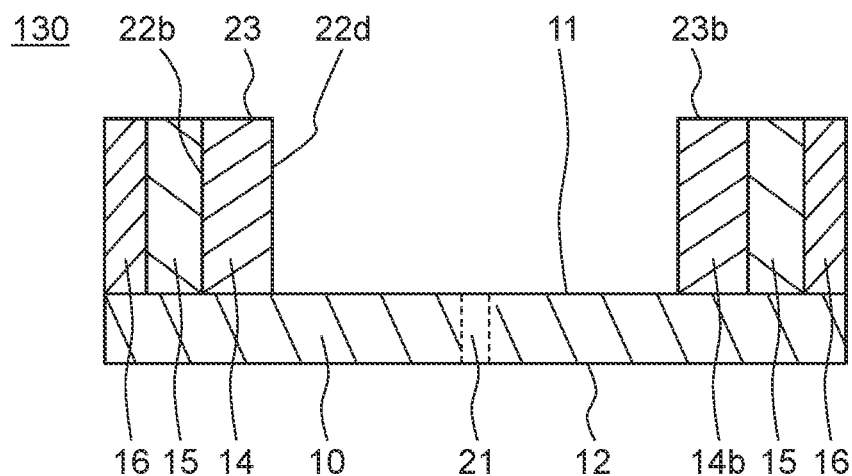
FIG. 7B is a sectional diagram of the semiconductor chip 130 according to the third embodiment.

FIG. 7 illustrates a plan view and a sectional diagram of the semiconductor chip 130 according to the third embodiment of the present disclosure. FIG. 7 (*a*) is a plan view of the semiconductor chip 130 when viewed from top, and FIG. 7 (*b*) is a cross-sectional view of the semiconductor chip 130 when viewed from a position A-A in FIG. 7 (*a*).

The semiconductor chip 130 is different from the semiconductor chip 110 in that the semiconductor chip 130 includes a ground sidewall 16. The ground sidewall 16 is formed on the first principal surface 11 of the semiconductor substrate 10 of the semiconductor chip 130. The ground sidewall 16 contacts the short-circuit prevention sidewall 15 and covers an outer peripheral wall surface of the short-circuit prevention sidewall 15 without discontinuity. The height of the ground sidewall 16 is the same as those of the short-circuit prevention sidewall 15 and the protrusion terminals 14 and 14*b*.

The ground sidewall 16 is made of gold and can be formed simultaneously with the protrusion terminals 14 and 14*b*.

Figure 8A:
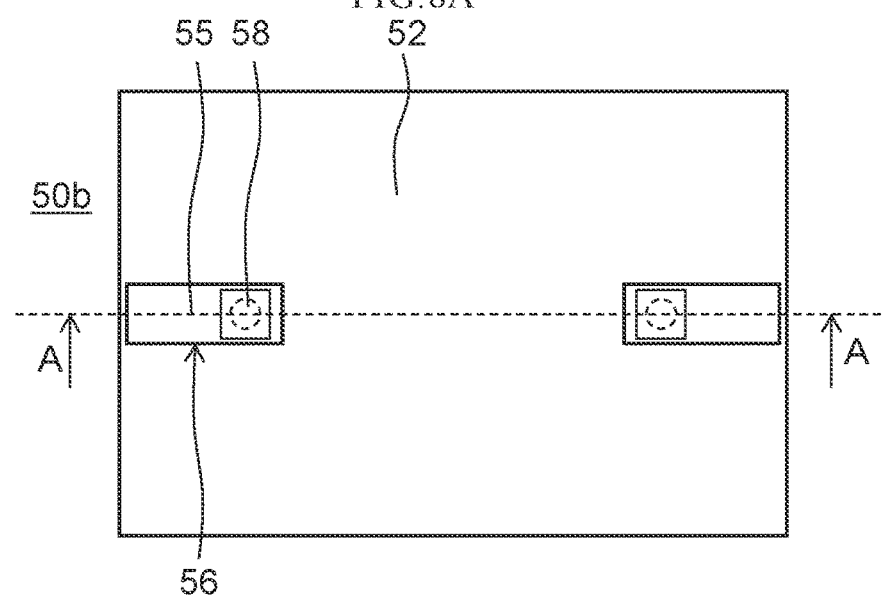
FIG. 8A is a plan view of a cap substrate 50b according to the third embodiment.
Figure 8B:
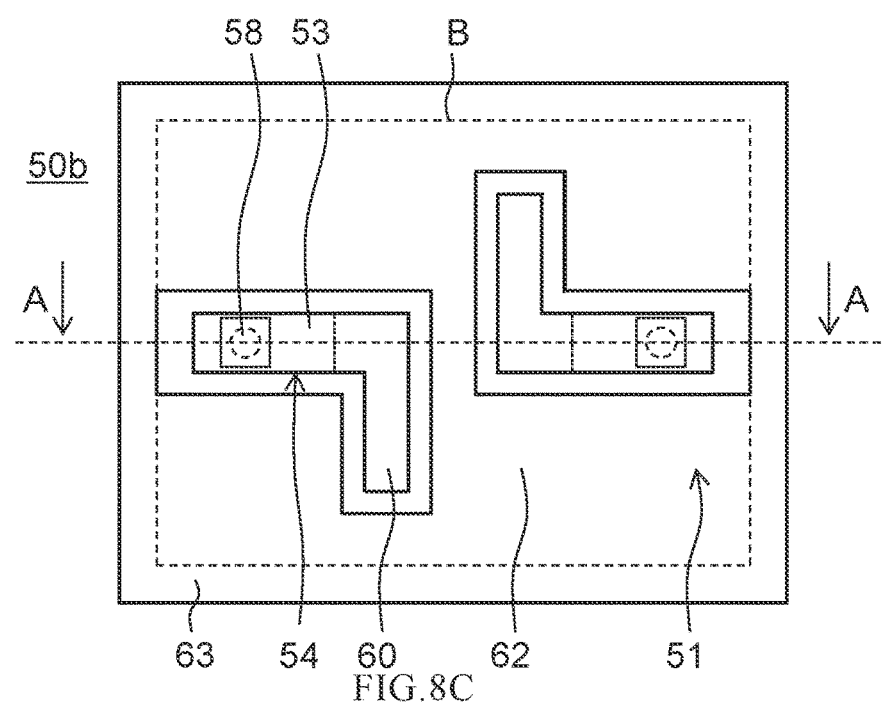
FIG. 8B is a bottom view of a cap substrate 50b according to the third embodiment.
Figure 8C:
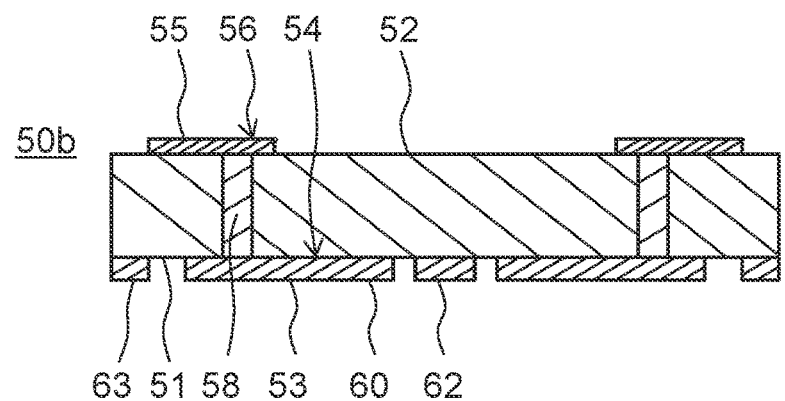
FIG. 8C is a sectional diagram of a cap substrate 50b according to the third embodiment.

FIG. 8 illustrates a plan view, a bottom view, and a sectional diagram of a cap substrate 50*b* according to the third embodiment of the present disclosure. FIG. 8 (*a*) is a plan view of the cap substrate 50*b* when viewed from top, FIG. 8 (*b*) is a bottom view of the cap substrate 50*b* when viewed from below, and FIG. 8 (*c*) is a cross-sectional view of the cap substrate 50*b* when viewed from a position A-A in FIG. 8 (*a*).

The cap substrate 50*b* is different from the cap substrate 50*a* in that the cap substrate 50*b* has a ground pattern 62. The ground pattern 62 is a conductor pattern separated from the circuit pattern 60 at a predetermined interval and formed on the entire third principal surface 51 of the cap substrate 50*b*. A dashed-dotted line B in FIG. 8 (*b*) indicates the position of the inner periphery of the ground sidewall 16 in a plan view when the cap substrate 50*b* and the semiconductor chip 130 are joined. The outer shapes of the cap substrate 50*b* and the semiconductor chip 130 when joined are set to match in a plan view. A peripheral part of the ground pattern 62 outside the dashed-dotted line B in the cap substrate 50*b* is referred to as a peripheral part 63.

Figure 9A:
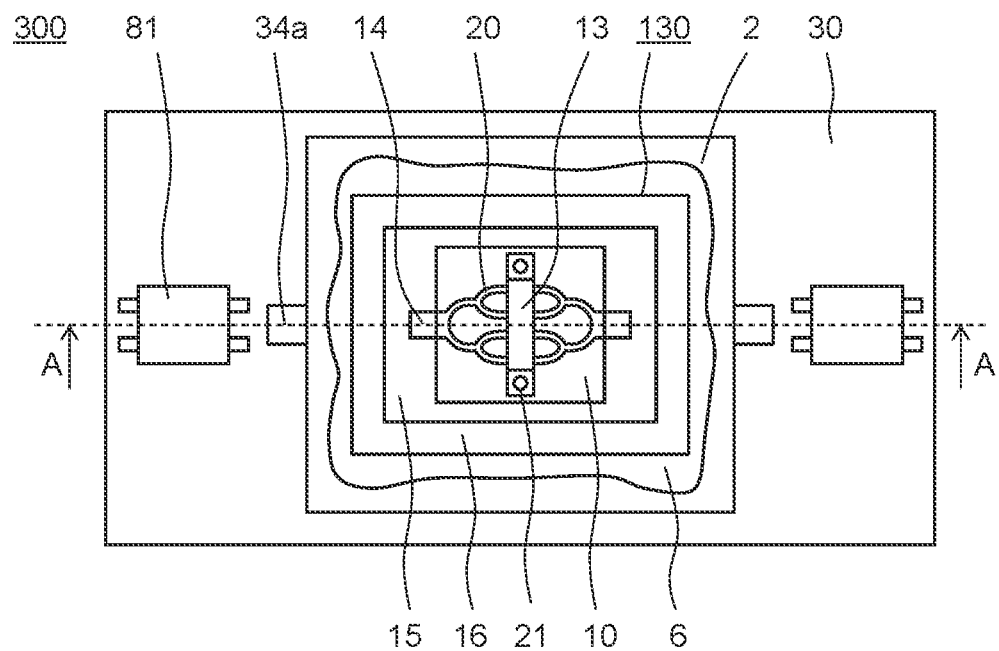
FIG. 9A is a plan view of a semiconductor apparatus 300 according to the third embodiment.
Figure 9B:
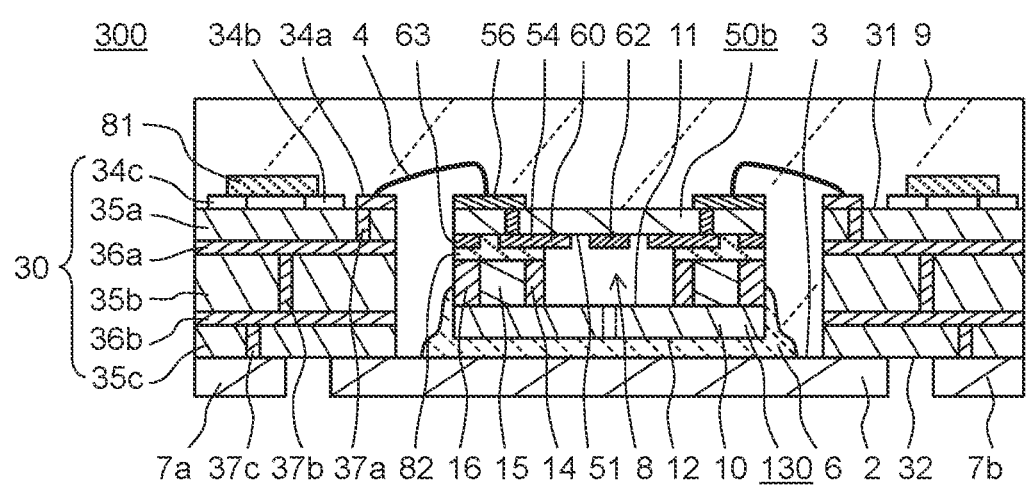
FIG. 9B is a sectional diagram of a semiconductor apparatus 300 according to the third embodiment.

FIG. 9 illustrates a plan view and a sectional diagram of a semiconductor apparatus 300 according to the third embodiment. FIG. 9 (*a*) is a plan view of the semiconductor apparatus 300 when viewed from top. However, FIG. 9 (*a*) does not illustrate the molding material 9, the cap substrate 50*b*, and the bonding wire 4. FIG. 9 (*b*) is a cross-sectional view of the semiconductor apparatus 300 when viewed from a position A-A in FIG. 9 (*a*).

The semiconductor apparatus 300 includes the semiconductor chip 130, the circuit substrate 30, the metal plate 2, the bonding wire 4, and the cap substrate 50*b*.

The semiconductor chip 130 is joined to the upper surface 3 of the metal plate 2 through the joint material 6. The ground sidewall 16 of the semiconductor chip 130 contacts the joint material 6, and the ground sidewall 16 is electrically connected to the metal plate 2.

The cap substrate 50*b* is joined to the protrusion terminal 14, the short-circuit prevention sidewall 15, and the ground sidewall 16 by using the anisotropic conductive film 82 with the third principal surface 51 facing the first principal surface 11 of the semiconductor substrate 10. In other words, the cap substrate 50*b* is joined to the short-circuit prevention sidewall 15 with the third principal surface 51 facing the first principal surface 11 through the short-circuit prevention sidewall 15.

The cap substrate 50*b* is joined to the short-circuit prevention sidewall 15 without a gap. As a result, the hollow space 8 positioned adjacent to the first principal surface 11 and the third principal surface 51 and surrounded and encapsulated by the semiconductor substrate 10, the short-circuit prevention sidewall 15, and the cap substrate 50*b* is formed.

The bottom surface positioned at the end part of the protrusion terminal 14 in the protrusion direction and the pad 53 (not illustrated) of the first wire 54 are arranged over each other in a plan view and electrically connected through the anisotropic conductive film 82. The peripheral part 63 of the ground pattern 62 and the ground sidewall 16 are arranged over each other in a plan view and electrically connected through the anisotropic conductive film 82. The protrusion terminal 14 and the ground pattern 62 are arranged not over each other in a plan view, and thus the protrusion terminal 14 and the ground pattern 62 are not electrically connected through the anisotropic conductive film 82. The pad 55 (not illustrated) of the second wire 56 and the conductor pattern 34*a* are electrically connected through the bonding wire 4.

The peripheral part 63 of the ground pattern 62 is electrically connected to the ground sidewall 16 through the anisotropic conductive film 82, and the ground sidewall 16 is electrically connected to the metal plate 2 through the conductive joint material 6 climbing to the ground sidewall 16. The metal plate 2 is a ground terminal of the semiconductor apparatus 300 and connected to a ground of the high-frequency amplifier when the semiconductor apparatus 300 is used. Thus, the ground pattern 62 is also connected to the ground of the high-frequency amplifier.

Accordingly, the ground pattern 62 and the circuit pattern 60 operate as a coplanar line with the ground pattern 62 as a grounding conductor metal and with the circuit pattern 60 as a signal conductor metal. The circuit pattern 60 is also an open stub and functions as a matching circuit that contributes to fundamental wave matching.

In the semiconductor apparatus 200 according to the second embodiment, there have been restrictions on the range of achievable characteristics of a matching circuit formed on the third principal surface 51 of the cap substrate 50a.

A line width, in other words, a pattern width needs to be increased to lower the characteristic impedance of the circuit pattern 60 forming a matching circuit. However, the area of the cap substrate 50a is small. Thus, it is difficult to form a low-impedance line that has a large line width and needs a large installation area. Furthermore, the line width needs to be increased to maintain the same characteristic impedance as the distance between a signal line and the ground increases. In the semiconductor apparatus 200, the ground corresponding to the circuit pattern 60 forming a matching circuit is the metal plate 2 and the distance between a signal line and the ground is large, which is another reason that a large line width is needed. Accordingly, the range of achievable characteristics of a matching circuit has been restricted.

However, in the semiconductor apparatus 300 according to the third embodiment, a coplanar line is configured with the circuit pattern 60 as a signal conductor metal and with the ground pattern 62 as a grounding conductor metal. In this case, line impedance does not depend on the distance between the metal plate 2 and the circuit pattern 60 and can be adjusted with the width of the signal conductor metal and the interval between the grounding conductor metal and the signal conductor metal. Accordingly, the freedom of setting for line impedance is obtained, and the restriction on the range of achievable characteristics of a matching circuit is relaxed. Thus, it is possible to improve high-frequency characteristics of the semiconductor apparatus 300.

Description of the other part is omitted.

As described above, the semiconductor apparatus 300 according to the third embodiment of the present disclosure includes the semiconductor chip 130 including the semiconductor substrate 10, the transistor 13, the protrusion terminal 14, and the short-circuit prevention sidewall 15, the semiconductor substrate 10 having the first principal surface 11 and the first back surface 12 opposite to each other, the transistor 13 being formed on the first principal surface 11, the protrusion terminal 14 being formed as a protrusion on the first principal surface 11, electrically connected to the transistor 13, and having a cross-sectional area larger than the cross-sectional area of the bonding wire 4, the short-circuit prevention sidewall 15 being insulating and provided at the peripheral part of the first principal surface 11 to cover the side surfaces 22a, 22b, and 22c of the protrusion terminal 14, the side surfaces 22a, 22b, and 22c facing circumference of the semiconductor substrate 10.

The semiconductor apparatus 300 also includes the circuit substrate 30, the metal plate 2, the cap substrate 50b, and the bonding wire 4, the circuit substrate 30 having the second principal surface 31 and the second back surface 32 opposite to each other, the conductor pattern 34a being formed on the second principal surface 31, the metal plate 2 having the upper surface 3 to which the first back surface 12 and the second back surface 32 are joined by the conductive joint material 6, the cap substrate 50b having the third principal surface 51 and the third back surface 52 opposite to each other, the third principal surface 51 being opposite to the first principal surface 11 through the short-circuit prevention sidewall 15 and being joined to the short-circuit prevention sidewall 15, the first wire 54 being formed on the third principal surface 51 and electrically connected to the bottom surface of the end part of the protrusion terminal 14 in the protrusion direction, the second wire 56 being formed on the third back surface 52 and electrically connected to the first wire 54 through the via hole 58, the bonding wire 4 connecting the second wire 56 and the conductor pattern 34a.

The short-circuit prevention sidewall 15 is provided around the peripheral part of the first principal surface 11 of the semiconductor substrate 10 without discontinuity. The semiconductor substrate 10, the short-circuit prevention sidewall 15, and the cap substrate 50b form the encapsulated hollow space 8 adjacent to the first principal surface 11 and the third principal surface 51. The semiconductor substrate 10, the short-circuit prevention sidewall 15, and the cap substrate 50b forming the hollow space 8 is sealed by the molding material 9.

The semiconductor chip 130 also includes the ground sidewall 16 that is conductive, provided on the first principal surface 11, and covers the outer peripheral wall surface of the short-circuit prevention sidewall 15, and the ground sidewall 16 is electrically connected to the metal plate 2 through the conductive joint material 6.

The circuit pattern 60 connected to the transistor 13, and the ground pattern 62 electrically connected to the ground sidewall 16 are provided on the third principal surface 51 of the cap substrate 50b. The circuit pattern 60 is configured as a coplanar line with the ground sidewall 16 as a grounding conductor metal and functions as a matching circuit.

With such a configuration, the same effects as those of the semiconductor apparatus 100 described in the first embodiment and the semiconductor apparatus 200 described in the second embodiment are achieved.

In addition, in the semiconductor apparatus 300 according to the third embodiment, a matching circuit provided on the cap substrate 50b is configured with a coplanar line with the circuit pattern 60 as a signal conductor metal and with the ground pattern 62 as a grounding conductor metal. Accordingly, it is possible to obtain the freedom of setting for line characteristic impedance and improve high-frequency characteristics of the semiconductor apparatus 300.

Fourth Embodiment

In the third embodiment, the joint material 6 climbs to the ground sidewall 16. However, it is difficult to control the amount of climbing of the joint material 6 in a manufacturing process. A fourth embodiment provides a structure that facilitates manufacturing of a semiconductor apparatus irrespective of climbing of the joint material 6.

The difference of the fourth embodiment from the third embodiment is difference in a cap substrate, and the other part is the same.

Figure 10A:
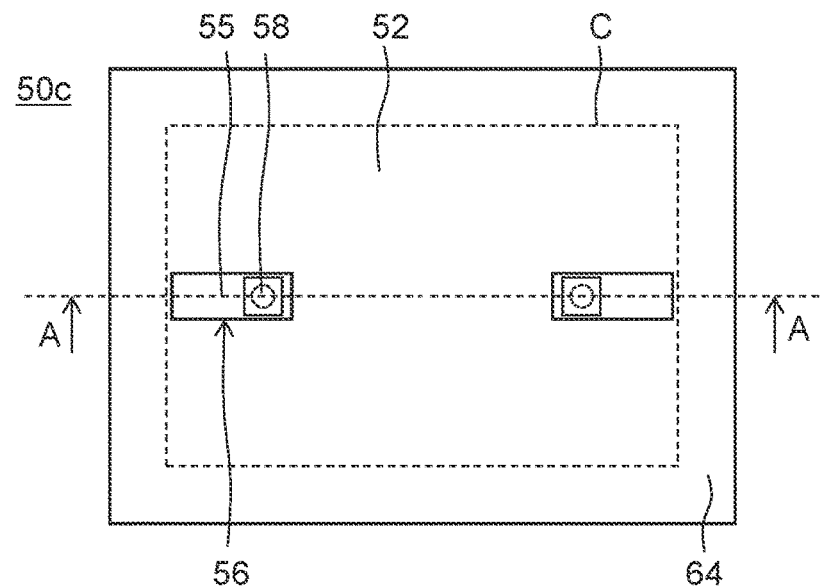
FIG. 10A is a plan view of a cap substrate 50c according to the fourth embodiment.
Figure 10B:
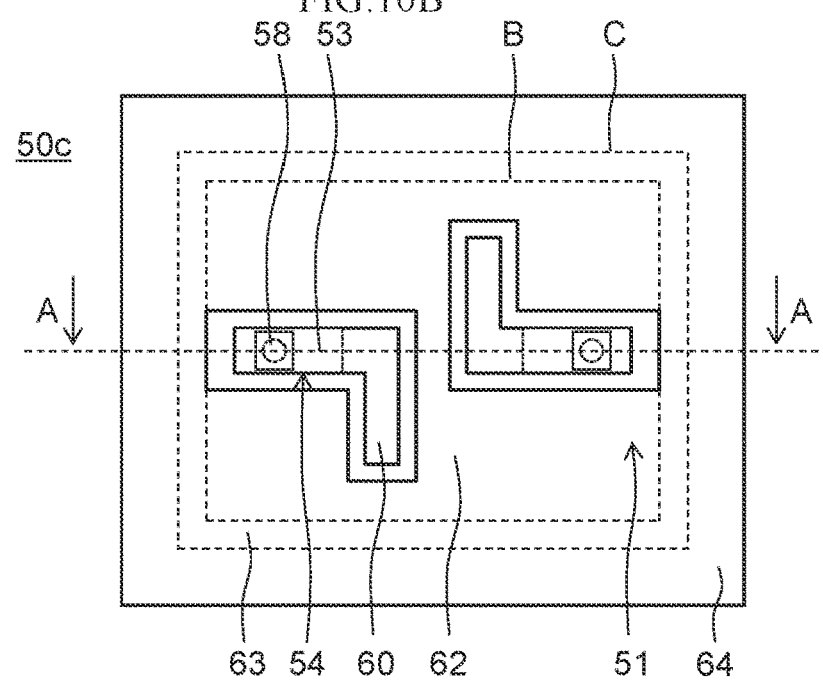
FIG. 10B is a bottom view of a cap substrate 50c according to the fourth embodiment.
Figure 10C:
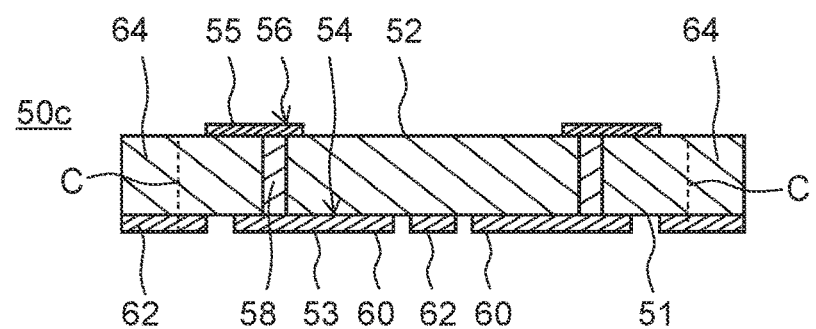
FIG. 10C is a sectional diagram of a cap substrate 50c according to the fourth embodiment.

FIG. 10 illustrates a plan view, a bottom view, and a sectional diagram of a cap substrate 50c according to the fourth embodiment of the present disclosure. FIG. 10 (a) is a plan view of the cap substrate 50c when viewed from top, FIG. 10 (b) is a bottom view of the cap substrate 50c when viewed from below, and FIG. 10 (c) is a cross-sectional view of the cap substrate 50c when viewed from a position A-A in FIG. 10 (a).

In FIG. 10, a dashed-dotted line C indicates the outer shape dimension of the cap substrate 50b. Inside the dashed-dotted line C, the structure of the cap substrate 50c is the same as the structure of the cap substrate 50b. Outside the dashed-dotted line C, the cap substrate 50c has a structure obtained by enlarging circumference of the cap substrate 50b. Part of the cap substrate 50c outside the dashed-dotted line C is referred to as a protrusion portion 64. The ground pattern 62 is separated from the circuit pattern 60 at a predetermined interval and provided on the entire third principal surface 51 of the cap substrate 50c including the protrusion portion 64.

Figure 11:
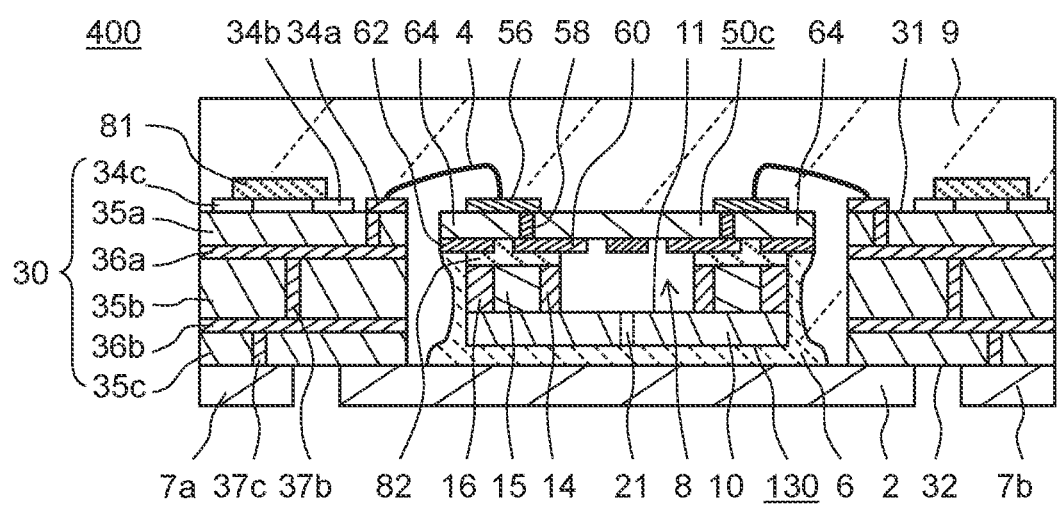
FIG. 11 is a cross-sectional view of the semiconductor apparatus 400 according to the fourth embodiment.

A semiconductor apparatus 400 according to the fourth embodiment of the present disclosure will be described below. FIG. 11 is a cross-sectional view of the semiconductor apparatus 400 according to the fourth embodiment. The position of the section corresponds to the position A-A in FIG. 9 (a). The semiconductor apparatus 400 includes the semiconductor chip 130, the circuit substrate 30, the metal plate 2, the bonding wire 4, and the cap substrate 50c.

The positional relation between the range of the cap substrate 50c inside the dashed-dotted line C (not illustrated) and the semiconductor chip 130 is the same as the positional relation between the cap substrate 50b and the semiconductor chip 130 in the third embodiment. The cap substrate 50c is arranged so that the dashed-dotted line C (not illustrated) and the outer shape of the semiconductor chip 130 match in a plan view. The part of the cap substrate 50c outside the dashed-dotted line C, in other words, the protrusion portion 64 extends outward from the outer shape of the semiconductor chip 130 in a plan view.

In the third embodiment, the joint material 6 climbs to a side surface of the ground sidewall 16 to electrically connect the ground sidewall 16 and the metal plate 2. The degree of climbing depends on the amount of the joint material 6. When the amount of the joint material 6 is excessive, the joint material 6 climbs to the third back surface 52 of the cap substrate 50b and potentially causes a failure of short circuit between the metal plate 2 and the second wire 56 formed on the third back surface 52 or the bonding wire 4. However, when the amount of the joint material 6 is insufficient, the ground sidewall 16 and the metal plate 2 are potentially not electrically connected. Since climbing occurs due to surface tension of the joint material, the amount of climbing varies even with the same amount of the joint material 6.

However, in the fourth embodiment, the cap substrate 50c is provided with the protrusion portion 64 extending outward from the semiconductor chip 130 in a plan view. Thus, in the third embodiment, even when the amount of the joint material 6 is increased to such an extent that the joint material 6 potentially exceeds the ground sidewall 16 and reaches the third back surface 52 of the cap substrate 50b, the protrusion portion 64 protruding as an eave from the side surface of the ground sidewall 16 in FIG. 11 interrupts above the joint material 6 climbing on the side surface of the ground sidewall 16, and thus the joint material 6 is unlikely to reach the third back surface 52 of the cap substrate 50c.

Accordingly, the maximum allowable use amount of the joint material 6 in an assembly process can be increased, which facilitates control of the amount of the joint material 6. Thus, it is possible to prevent time increase of the assembly process. Note that the above-described effect is obtained even when the ground pattern 62 is not provided at the protrusion portion 64.

Note that, in the semiconductor apparatus 200 in the second embodiment as well, similarly to the semiconductor apparatus 400 in the fourth embodiment, the effect of facilitating control of the amount of the joint material 6 is obtained by providing, to the cap substrate 50a, a protrusion portion extending outward from the outer periphery of the semiconductor chip 110 in a plan view.

Description of the other part is omitted.

As described above, the semiconductor apparatus 400 according to the fourth embodiment of the present disclosure includes the semiconductor chip 130 including the semiconductor substrate 10, the transistor 13, the protrusion terminal 14, and the short-circuit prevention sidewall 15, the semiconductor substrate 10 having the first principal surface 11 and the first back surface 12 opposite to each other, the transistor 13 being formed on the first principal surface 11, the protrusion terminal 14 being formed as a protrusion on the first principal surface 11, electrically connected to the transistor 13, and having a cross-sectional area larger than the cross-sectional area of the bonding wire 4, the short-circuit prevention sidewall 15 being insulating and provided at the peripheral part of the first principal surface 11 to cover the side surfaces 22a, 22b, and 22c of the protrusion terminal 14, the side surfaces 22a, 22b, and 22c facing circumference of the semiconductor substrate 10.

The semiconductor apparatus 400 also includes the circuit substrate 30, the metal plate 2, the cap substrate 50c, and the bonding wire 4, the circuit substrate 30 having the second principal surface 31 and the second back surface 32 opposite to each other, the conductor pattern 34a being formed on the second principal surface 31, the metal plate 2 having the upper surface 3 to which the first back surface 12 and the second back surface 32 are joined by the conductive joint material 6, the cap substrate 50c having the third principal surface 51 and the third back surface 52 opposite to each other, the third principal surface 51 being opposite to the first principal surface 11 through the short-circuit prevention sidewall 15 and being joined to the short-circuit prevention sidewall 15, the first wire 54 being formed on the third principal surface 51 and electrically connected to the bottom surface of the end part of the protrusion terminal 14 in the protrusion direction, the second wire 56 being formed on the third back surface 52 and electrically connected to the first wire 54 through the via hole 58, the bonding wire 4 connecting the second wire 56 and the conductor pattern 34a.

The short-circuit prevention sidewall 15 is provided around the peripheral part of the first principal surface 11 of the semiconductor substrate 10 without discontinuity. The semiconductor substrate 10, the short-circuit prevention sidewall 15, and the cap substrate 50c form the encapsulated hollow space 8 adjacent to the first principal surface 11 and the third principal surface 51. The semiconductor substrate 10, the short-circuit prevention sidewall 15, and the cap substrate 50c forming the hollow space 8 are sealed by the molding material 9.

The semiconductor chip 130 also includes the ground sidewall 16 that is conductive, provided on the first principal surface 11, and covers the outer peripheral wall surface of the short-circuit prevention sidewall 15, and the ground sidewall 16 is electrically connected to the metal plate 2 through the conductive joint material 6.

The circuit pattern 60 connected to the transistor 13, and the ground pattern 62 electrically connected to the ground sidewall 16 are provided on the third principal surface 51 of the cap substrate 50c. The circuit pattern 60 is configured as a coplanar line with the ground sidewall 16 as a grounding conductor metal and functions as a matching circuit. The cap substrate 50c includes the protrusion portion 64 extending outward from the outer shape of the semiconductor chip 130 in a plan view.

With such a configuration, the same effects as those of the semiconductor apparatus 100 described in the first embodiment, the semiconductor apparatus 200 described in the second embodiment, and the semiconductor apparatus 300 described in the third embodiment are achieved.

In addition, in the semiconductor apparatus 400 according to in the fourth embodiment, the protrusion portion 64 protrudes as an eave from the semiconductor chip 130 and interrupts above the joint material 6, and thus the joint material 6 is unlikely to reach the third back surface 52 of the cap substrate 50c. Accordingly, the maximum allowable use amount of the joint material 6 in an assembly process can be increased, which facilitates control of the amount of the joint material 6. Thus, it is possible to prevent time increase of the assembly process.

Note that the material of the semiconductor substrate 10 may be, for example, silicon (Si), gallium arsenide (GaAs), gallium nitride on silicon (GaN on Si), gallium nitride on gallium nitride (GaN on GaN), or gallium nitride on diamond (GaN on Diamond).

The material of the cap substrate may be, for example, GaN on Si, GaN on GaN, or GaN on Diamond.

The transistor 13 may be, for example, a field effect transistor (FET) or a heterojunction bipolar transistor (HBT).

A plurality of semiconductor chips may be joined to the metal plate 2, and each semiconductor chip may include no matching circuit.

The material of the metal plate 2, the input terminal 7a, and the output terminal 7b may be a low heat resistance material such as copper tungsten or copper molybdenum, or a stacked material of copper/molybdenum/copper or the like.

The material of the protrusion terminal 14 and the ground sidewall 16 may be, for example, aluminum, copper, or an alloy.

Note that, in a case in which the circuit substrate 30 has a single-layer substrate, the present disclosure is effective when the distance between the principal surface of the semiconductor chip and the principal surface of the single-layer substrate is long and the wire length is long, for example, when the substrate thickness is increased to increase mechanical strength.

As described above, each semiconductor apparatus in the present disclosure has reduced heat resistance of the transistor and reduced degradation of high-frequency characteristics and is preferable as a semiconductor apparatus that amplifies a high-frequency wave and more preferable as a semiconductor apparatus for electric power amplification.

The present disclosure is not limited to the above-described examples but includes various modifications. For example, the examples are described in detail for easiness of understanding of the present disclosure and are not necessarily limited to a structure including all configurations described above.

Part of a configuration in an example may be replaced with a configuration in another example, and a configuration in an example may be added to a configuration in another example. Part of a configuration in each example may be subjected to addition, deletion, and replacement with another configuration.

REFERENCE SIGNS LIST 2 metal plate, 3 upper surface, 4 bonding wire, 6 joint material, 8 hollow space, 9 molding material, 7a input terminal, 7b output terminal, 10 semiconductor substrate, 11 first principal surface, 12 first back surface, 13 transistor, 14 protrusion terminal, 15 short-circuit prevention sidewall, 16 ground sidewall, 21 via hole, 22a, 22b, 22c, 22d side surface, 23, 23b end part, 30 circuit substrate, 31 second principal surface, 32 second back surface, 34a, 34b, 34c conductor pattern, 50a, 50b, 50c cap substrate, 51 third principal surface, 52 third back surface, 54 first wire, 56 second wire, 60 circuit pattern, 62 ground pattern, 64 protrusion portion, 81 electronic component, 100, 200, 300, 400 semiconductor apparatus, 110, 130 semiconductor chip

The invention claimed is:

1. A semiconductor apparatus comprising:
a semiconductor chip including a semiconductor substrate, a transistor, a protrusion terminal, and a short-circuit prevention sidewall, the semiconductor substrate having a first principal surface and a first back surface opposite to each other, the transistor being formed on the first principal surface, the protrusion terminal being formed as a protrusion on the first principal surface and electrically connected to the transistor, the short-circuit prevention sidewall being insulating and provided at a peripheral part of the first principal surface to cover a side surface of the protrusion terminal, the side surface facing circumference of the semiconductor substrate;
a circuit substrate having a second principal surface and a second back surface opposite to each other, a conductor pattern being formed on the second principal surface;
a metal plate having an upper surface, the first back surface being joined to the upper surface by a conductive joint material, the second back surface being joined to the upper surface; and
a bonding wire connecting an end part of the protrusion terminal in a protrusion direction and the conductor pattern, wherein
the protrusion terminal has a cross-sectional area larger than a cross-sectional area of the bonding wire.

2. The semiconductor apparatus according to claim 1, wherein the short-circuit prevention sidewall is provided around the peripheral part of the first principal surface without discontinuity.

3. A semiconductor apparatus comprising:
a semiconductor chip including a semiconductor substrate, a transistor, a protrusion terminal, and a short-circuit prevention sidewall, the semiconductor substrate having a first principal surface and a first back surface opposite to each other, the transistor being formed on the first principal surface, the protrusion terminal being formed as a protrusion on the first principal surface and electrically connected to the transistor, the short-circuit prevention sidewall being insulating and provided at a peripheral part of the first principal surface to cover a side surface of the protrusion terminal, the side surface facing circumference of the semiconductor substrate;

a circuit substrate having a second principal surface and a second back surface opposite to each other, a conductor pattern being formed on the second principal surface;

a metal plate having an upper surface, the first back surface being joined to the upper surface by a conductive joint material, the second back surface being joined to the upper surface;

a cap substrate having a third principal surface and a third back surface opposite to each other, the third principal surface facing the first principal surface through the short-circuit prevention sidewall and being joined to the short-circuit prevention sidewall, a first wire being formed on the third principal surface and electrically connected to an end part of the protrusion terminal in a protrusion direction, a second wire being formed on the third back surface and electrically connected to the first wire; and a bonding wire connecting the second wire and the conductor pattern, wherein the protrusion terminal has a cross-sectional area larger than a cross-sectional area of the bonding wire.

4. The semiconductor apparatus according to claim 3, wherein the short-circuit prevention sidewall is provided around the peripheral part of the first principal surface without discontinuity.

5. The semiconductor apparatus according to claim 4, wherein a matching circuit connected to the transistor is additionally provided on the third principal surface of the cap substrate.

6. The semiconductor apparatus according to claim 5, wherein the semiconductor substrate, the short-circuit prevention sidewall, and the cap substrate form an encapsulated hollow space adjacent to the first principal surface and the third principal surface, and the semiconductor substrate, the short-circuit prevention sidewall, and the cap substrate forming the hollow space are sealed by a molding material.

7. The semiconductor apparatus according to claim 5, wherein the semiconductor chip further includes a ground sidewall that is conductive, provided on the first principal surface, and covers an outer peripheral wall surface of the short-circuit prevention sidewall, the ground sidewall is electrically connected to the metal plate through the conductive joint material, the cap substrate further includes a ground pattern provided on the third principal surface and electrically connected to the ground sidewall, and the matching circuit is formed of a coplanar line with the ground pattern as a grounding conductor metal.

8. The semiconductor apparatus according to claim 4, wherein the cap substrate includes a protrusion portion extending outward from an outer shape of the semiconductor chip in a plan view.

9. The semiconductor apparatus according to claim 3, wherein a matching circuit connected to the transistor is additionally provided on the third principal surface of the cap substrate.

10. The semiconductor apparatus according to claim 4, wherein the semiconductor substrate, the short-circuit prevention sidewall, and the cap substrate form an encapsulated hollow space adjacent to the first principal surface and the third principal surface, and the semiconductor substrate, the short-circuit prevention sidewall, and the cap substrate forming the hollow space are sealed by a molding material.

11. The semiconductor apparatus according to claim 3, wherein a matching circuit connected to the transistor is additionally provided on the third back surface of the cap substrate.

12. The semiconductor apparatus according to claim 1, wherein the semiconductor chip amplifies a high-frequency wave.

13. The semiconductor apparatus according to claim 1, wherein a via hole penetrating through the semiconductor substrate is provided and the transistor is connected to the metal plate through the via hole.

14. The semiconductor apparatus according to claim 3, wherein the semiconductor chip amplifies a high-frequency wave.

15. The semiconductor apparatus according to claim 3, wherein a via hole penetrating through the semiconductor substrate is provided and the transistor is connected to the metal plate through the via hole.

* * * * *